United States Patent [19]

Rorden

[11] Patent Number: 4,686,689
[45] Date of Patent: Aug. 11, 1987

[54] PHASE-LOCKED LOOP CIRCUIT

[75] Inventor: William L. Rorden, Grass Valley, Calif.

[73] Assignee: Graham-Patten Systems, Inc., Grass Valley, Calif.

[21] Appl. No.: 890,426

[22] Filed: Jul. 24, 1986

[51] Int. Cl.$^4$ .......................... H03D 3/18; H03D 3/24
[52] U.S. Cl. ........................................ 375/81; 329/50; 329/124; 375/85
[58] Field of Search ............... 375/81, 85, 86; 329/50, 329/110, 122, 124; 331/1 A, 12, 18, 25; 307/262, 269, 511; 342/103; 328/133

[56] References Cited

U.S. PATENT DOCUMENTS 4,027,265  5/1977  Kobayashi et al. ................. 329/122
4,484,337  11/1984  Leclert et al. ........................ 375/81
4,555,667  11/1985  Cressey et al. ...................... 329/124

Primary Examiner—Benedict V. Safourek
Attorney, Agent, or Firm—Dellett, Smith-Hill and Bedell

[57] ABSTRACT

A phase-locked loop circuit receives an input signal that has a predetermined frequency during a succession of symbol intervals and of which the phase during a given symbol interval is related to the phase during a reference interval by the angle $2n\pi/N$, where N is a positive integer and n is an integer in the range from 0 to $(N-1)$, and generates a reference signal of which the phase has a desired relationship to the phase of the input signal during the reference interval. The circuit comprises a controllable oscillator that is responsive to a control signal to generate the reference signal, the frequency of the reference signal being equal to the predetermined frequency when the value of the control signal is zero. The circuit also comprises a demodulator for generating a first signal representative of the sine of the phase of the input signal relative to the reference signal and for generating a second signal representative of the cosine of the phase of the input signal relative to the reference signal, and a function generator for receiving the first and second signals and generating the control signal such that when the phase of the input signal relative to the reference signal is equal to $2n\pi/N$ plus the phase of the input signal relative to the reference signal during the reference interval, the value of the control signal is zero and the first derivative of the value of the control signal with respect to phase of the input signal relative to the reference signal is positive.

13 Claims, 3 Drawing Figures

PHASE-LOCKED LOOP CIRCUIT

This invention relates to a phase-locked loop circuit.

BACKGROUND OF THE INVENTION

In order to transmit information over a signal transmission channel, it is conventional to use the information to modulate a carrier and impress the modulated carrier on the transmission channel. At the receiver, the received signal is demodulated and the modulation function is recreated, and the transmitted information is extracted from the modulation function. If the information to be transmitted is in analog form, the modulation is generally of the amplitude or frequency of the carrier and the modulation function is able to vary continuously, whereas if the information is in digital form the modulation is usually of the phase of the carrier, or both the amplitude and phase of the carrier, and the modulation function is a pattern having a finite number, generally an integral power of two, of distinct states.

In the case of digital information, the epoch over which information is transmitted is divided into a succession of symbol intervals that are of equal duration. During each symbol interval, the modulation function assumes a state associated with a given symbol and the phase (or amplitude and phase) of the carrier at the transmitter remains constant. In a given symbol interval, a modulation pattern having $2^k$ distinct states can be used to transmit k bits of information. Thus, a pattern having two distinct states (i.e., binary modulation) can be used to transmit one bit of information during one symbol interval, a modulation pattern having four distinct states can be used to transmit two bits, and so on up to a limit determined by the signal to noise ratio of the transmission channel.

A common method of modulating a carrier in accordance with a modulation pattern having four states (i.e., k=2) is quadrature phase shift keying (QPSK), in which the phase of the carrier is modulated such that during any given symbol interval the carrier at the transmitter has one of four discrete phase angles relative to a reference carrier.

There are two types of QPSK modulation, namely absolute QPSK and differential QPSK. In absolute QPSK, the transmitted information is represented by the phase of the carrier within a symbol interval relative to the reference carrier, whereas in differential QPSK the transmitted information is represented by the phase of the carrier within a symbol interval relative to the phase of the carrier within the previous symbol interval, i.e., the phase shift from interval to interval.

QPSK modulation in a random data pattern substantially eliminates energy at the carrier frequency. Unless a reference carrier is added to the signal or carried on a separate channel, a simple PLL will not be able to regenerate the reference carrier. However differential QPSK can be successfully demodulated if a local carrier of exact frequency and stable phase is available. To detect only changes in phase, the original reference phase is not needed.

A signal at the carrier frequency may be synthesized by locking a signal at N times the carrier frequency (where N is the number of phase states in the modulation pattern, i.e., four in the case of QPSK) to the received signal, and then dividing the frequency of the signal by N in order to recover the exact carrier frequency. This method is subject to the disadvantage that there is no necessary phase relationship between the received signal and the synthesized signal, and therefore an additional step must be carried out in order to set the synthesized signal to the desired phase. In addition, this known method is difficult to implement at high carrier frequencies.

U.S. Pat. No. 4,308,505 discloses a circuit employing a phase-locked loop (PLL) in order to synthesize a replica of the reference carrier. Operation of the carrier recovery PLL is dependent on recovery of a timing signal related to data transitions. The carrier phase is controlled within the boundaries of a phase window by digital feedback to a voltage controlled oscillator (VCO), with the rate of change limited by a loop filter. The size of the phase window potentially increases the data error rate of a data recovery system using the PLL.

SUMMARY OF THE INVENTION

A preferred embodiment of the present invention is a circuit that receives an input signal that has a predetermined frequency during a succession of symbol intervals and of which the phase during a given symbol interval is related to the phase during a reference interval by the angle $2n\pi/N$, where N is a positive integer and n is an integer in the range from 0 to (N−1), and generates a reference signal of which the phase has a desired relationship to the phase of the input signal during the reference interval. The circuit comprises a controllable oscillator that is responsive to a control signal to generate the reference signal, the frequency of the reference signal being equal to the predetermined frequency when the value of the control signal is zero. The circuit also comprises a demodulator for generating a first signal representative of the sine of the phase of the input signal relative to the reference signal and for generating a second signal representative of the cosine of the phase of the input signal relative to the reference signal, and a function generator for receiving the first and second signals and generating the control signal such that when the phase of the input signal relative to the reference signal is equal to $2n\pi/N$ plus the phase of the input signal relative to the reference signal during the reference interval, the value of the control signal is zero and the first derivative of the value of the control signal with respect to phase of the input signal relative to the reference signal is positive.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
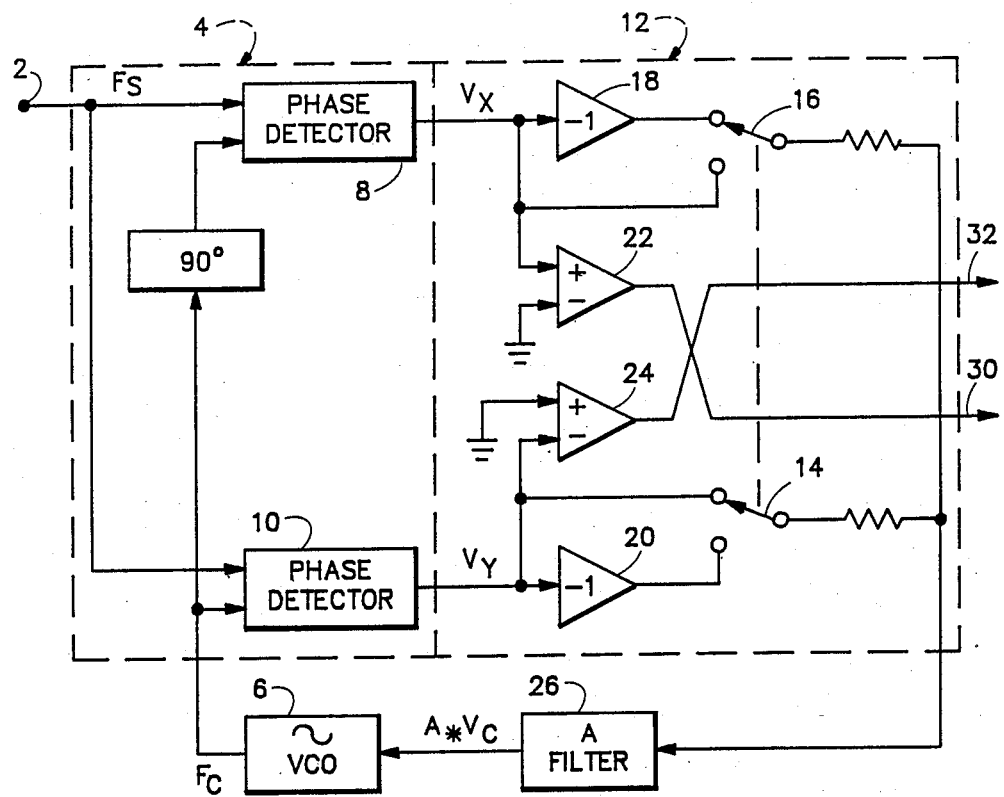
FIG. 1 is a block diagram of a phase-locked loop circuit embodying the present invention.

The circuit illustrated in FIG. 1 has an input terminal 2 at which it receives a signal comprising a carrier wave that has been modulated in phase in accordance with a modulation pattern having four distinct states. The carrier phases associated with the four modulation states are in quadrature, and may be represented by the vectors $P_1 \ldots P_4$ shown in FIG. 2.

Figure 3:
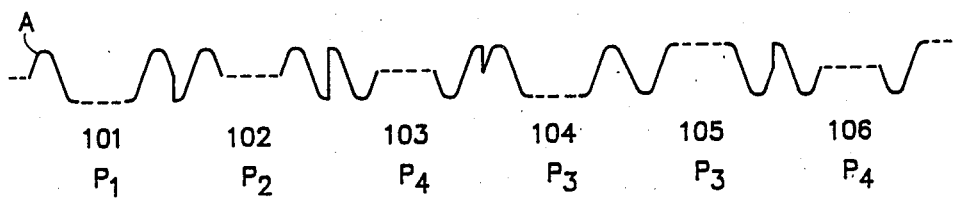
FIG. 3 illustrates the waveform of a QPSK signal over a succession of symbol intervals.

The received carrier might have the waveform indicated at A in FIG. 3. As shown in FIG. 3, the waveform epoch over which the signal is received is divided into a succession of symbol intervals, which are arbitrarily numbered 101, 102, 103 etc., in FIG. 3, and during each symbol interval the received carrier has a constant frequency $F_s$ and has a constant phase. The phase $P_i$ of the signal during a given symbol interval is related to the phase during the preceding interval by the equation $$P_i = P_{i-1} + n\pi/2 \tag{1}$$

where n is an integer in the range from 0 to 3. Thus, if the phase $P_1$ during the interval 101 is taken as zero, the phase $P_2$ during the interval 102 is $\pi/2$ and the phases $P_4$ and $P_3$ during the intervals 103 and 104 are, respectively, $3\pi/2$ and $\pi$.

The useful information conveyed by the signal is contained in the phase difference $P_i - P_{i-1}$, and therefore in order to extract the useful information from the signal it is necessary to determine the value of n. For example, the value of n for the change in phase between symbol intervals 101 and 102 is 1, and the values of n for the subsequent phase changes are 2 (103, 102), 3 (104, 103), 0 (105, 104) and 1 (106, 105).

Between consecutive symbol intervals is a data transition, at which the phase of the carrier may change. The data transitions are shown in FIG. 3 as being instantaneous, but it will be appreciated that there would in fact be a non-zero rise time associated with any change in carrier phase. Moreover, FIG. 3 illustrates the symbol interval as being an odd number of half periods of the carrier and shows the data transitions as taking place at zero crossings and peaks of the carrier, but the circuit shown in FIG. 1 does not require any specific relationship between the symbol interval and the carrier period, and therefore the transitions need not take place at any particular point in the carrier cycle.

The input signal received at the terminal 2 of the circuit shown in FIG. 1 is applied to a demodulator 4 that also receives the output signal of a voltage controlled oscillator (VCO) 6. The demodulator comprises a pair of phase detectors 8 and 10 that are driven in quadrature by the output signal of the VCO 6.

Figure 2:
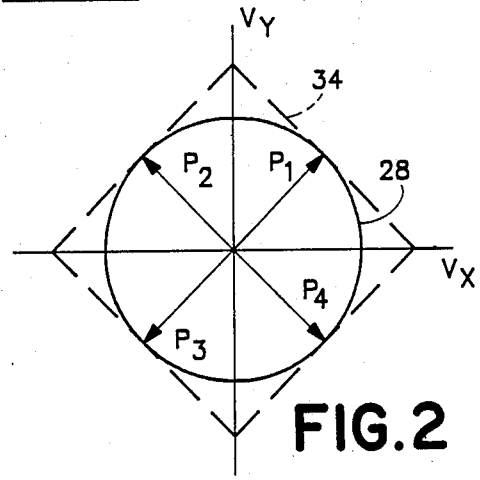
FIG. 2 is a vector diagram indicating the carrier phases of a QPSK signal.

If the phase angle of the output signal of the VCO relative to the input signal at the terminal 2 is P, then the output signal of the phase detector 8 is a voltage $V_x$ that is proportional to cos P and the output signal of the phase detector 10 is a voltage $V_y$ that is proportional to sin P. The locus of the points $(V_x, V_y)$ in the vector diagram of FIG. 2 is a circle 28 having its center at the point of intersection of the phase vectors $P_1 \ldots P_4$ and of radius equal to the length of the vectors.

The output signals of the phase detectors 8 and 10 are applied to a function generator 12. The function generator comprises switches 14 and 16, inverters 18 and 20 and high gain comparators 22 and 24, and provides an output signal of voltage $V_c$ which is given by the following equation:

$$V_c = S_1 * V_y + S_2 * V_x \tag{2}$$

The values of $S_1$ and $S_2$ depend on the states of the switches 14 and 16 respectively, and the states of these switches in turn depend upon the signs of $V_x$ and $V_y$ respectively. Thus, if $V_x$ is positive, the switch 14 selects the input of the inverter 20 and $S_1$ is equal to $+1$. If $V_x$ is negative, the switch 14 selects the output to the inverter 20 and $S_1$ is equal to $-1$. Similarly, if $V_y$ is positive, the switch 16 selects the output of the inverter 18 and $S_2$ is $-1$, whereas if $V_y$ is negative the switch 16 selects the input of the inverter 16 and $S_2$ is $+1$.

The output signal of the function generator 12 is applied to a loop filter 26 having a transfer function A and the loop filter applies an output voltage $A*V_c$ to the control input of the VCO 6. The output signal of the VCO 6 has a frequency $F_c$ which is given by $$F_c = F_o + A * V_c \tag{3}$$

where $F_o$ is the nominal frequency of the oscillator. In order for $F_c$ to be equal to $F_o$, $V_c$ must be equal to zero and therefore $S_1*V_y$ must be equal to $-S_2*V_x$. This relationship is satisfied for four values of P, indicated in the following table.

| P | $V_x$ | $V_y$ | $S_1$ | $S_2$ | $V_c$ | $dV_x/dP$ | $dV_y/dP$ | $dV_c/dP$ |
|---|---|---|---|---|---|---|---|---|
| $\pi/4$ | +.707 | +.707 | +1 | −1 | 0 | −.707 | +.707 | +1.414 |
| $3\pi/4$ | −.707 | +.707 | −1 | −1 | 0 | −.707 | −.707 | +1.414 |
| $5\pi/4$ | −.707 | −.707 | −1 | +1 | 0 | +.707 | −.707 | +1.414 |
| $7\pi/4$ | +.707 | −.707 | +1 | +1 | 0 | +.707 | +.707 | +1.414 |

It will be seen from the table that the phase angles for which $S_1*V_y$ is equal to $-S_2*V_x$ are in quadrature.

It will also be seen that for each value of P for which $V_c$ is equal to 0, the first derivative of $V_c$ with respect to P is positive and therefore the first derivative of $F_c$ with respect to P also is positive, i.e. is such as to force the frequency $F_c$ to change so as to maintain a constant phase relationship between the carrier and the output signal of the VCO 6. Accordingly, the two conditions for a stable phase lock apply when P has any one of the above four values. Consequently, when a QPSK signal having a carrier frequency $F_s$ is applied to the terminal 2, the phase-locked loop will lock to one of the modulation states of the input signal. The frequency $F_c$ of the VCO's output signal will be equal to $F_s$ and the VCO's output signal will be shifted in phase from the input signal by $(2n+1)\pi/4$. Once the output signal of the VCO 6 has become locked to the input signal received at the terminal 2, regardless of the modulation state of the input signal at the time that lock is achieved, the output signal remains locked to the input signal and will not change in phase relative to the reference carrier or in frequency so long as the modulation pattern of the input signal conforms to the four states. The data can then be recovered by logical interpretation of the output signals provided by the comparators 22 and 24 at the terminals 30 and 32 respectively.

The transfer function A of the loop filter 26 is such that the expression $A*V_c$ has a term proportional to $V_c$ and a term proportional to the integral of $V_c$ with respect to time. Consequently, the phase-locked loop is a second order loop and is able to achieve a zero phase error between the signal at the terminal 2 and the output of the VCO 6. It is necessary to have a zero phase error, or at least a known phase relationship, between the signals in order to be able to recover the data used to modulate the carrier. However, even if the transfer function A were such that the expression $A*V_c$ did not include a term proportional to the integral of $V_c$, i.e., the phase-locked loop was a first order loop, the data can be recovered if separate means are used to determine the phase relationship between the output signal of VCO and the carrier phases.

In order to ensure that data transitions do not disturb the phase-locked loop, the rise time of the data transitions must be less than the response time of the loop filter and greater than the rise time of the carrier channel.

An embodiment of the invention was constructed with the following parameters:

Carrier frequency ($F_o$): 6 MHz
Symbol interval: 1.29 s
Bandwidth: 1 MHz
Modulation: Differential QPSK In operation of this embodiment, the output signal of the VCO remained locked to the input signal with a carrier to noise ratio of less than 12 dB. The bit error rate was less than one part in 100,000 at a carrier-to-noise ratio of 15 dB.

It will be appreciated that the invention is not restricted to the embodiment described with reference to the drawings, and that modifications may be made therein without departing from the scope of the invention as defined in the appended claims and equivalents thereof. For example, the voltages $V_x$ and $V_y$ need not be proportional to sinusoidal functions of the phase difference P, so long as they define P unambiguously. It is in fact preferred that $V_x$ and $V_y$ be linear functions of P, such that the locus of points ($V_x$, $V_y$) in the vector diagram of FIG. 2 is not a circle but is a square 34, as shown in dashed lines. In the case of the locus being a square having its sides perpendicular to the vectors $P_1 \ldots P_4$, the values of $V_x$ and $V_y$ are substantially equivalent to the cosine and sine respectively of the phase difference between the input signal and the reference signal. The invention is not restricted to use with differential QPSK modulation, and may be applied to absolute QPSK modulation provided that it is possible to determine which of the carrier phases is the reference phase.

I claim:

1. A phase-locked loop circuit for receiving an input signal that has a predetermined frequency during a succession of intervals and of which the phase during a given interval is related to the phase during a reference interval by the angle $2n\pi/N$, where N is a positive integer and n is an integer in the range from 0 to $N-1$, the circuit being operative to generate a reference signal of which the phase bears a desired relationship to the phase of the input signal during the reference interval and comprising a controllable oscillator that is responsive to a control signal to generate the reference signal, the frequency of the reference signal being a function of the value of the control signal and bearing a predetermined relationship to the predetermined frequency when the value of the control signal is substantially zero, and the circuit also comprising a demodulator for providing an output that unambiguously defines the phase of the input signal relative to the reference signal, and a function generator for receiving the output of the demodulator and generating the control signal such that when the phase of the input signal relative to the reference signal is equal to $2n\pi/N$ plus the phase of the input signal relative to the reference signal during the reference interval, the value of the control signal is zero and the first derivative of the value of the control signal with respect to the phase of the input signal relative to the reference signal is such that a change in the value of the control signal causes the frequency of the reference signal to change in such a manner as to restore the value of the control signal to zero.

2. A circuit according to claim 1, wherein the output of the demodulator comprises a first signal representative of the cosine of the phase of the input signal relative to the reference signal and a second signal representative of the sine of the phase of the input signal relative to the reference signal.

3. A circuit according to claim 2, wherein the demodulator comprises first and second linear phase detectors which provide said first and second signals respectively.

4. A circuit according to claim 1, wherein the output of the demodulator comprises first and second signals such that for small values of the phase of the input signal relative to the reference signal the first signal is substantially representative of the cosine of the phase of the input signal relative to the reference signal and the second signal is substantially representative of the sine of the phase of the input signal relative to the reference signal.

5. A circuit according to claim 1, wherein the output of the demodulator comprises first and second signals, N is equal to 4, and the function generator is such that the value of the control signal is given by the relationship $$V_c = S_1 * V_y + S_2 * V_x$$

where $V_c$ represents the value of the control signal, $V_x$ represents the value of the first signal, $V_y$ represents the value of the second signal, $S_1$ is equal to 1 if $V_x$ is greater than 0 and is equal to $-1$ if $V_x$ is less than 0 and $S_2$ is equal to 1 if $V_y$ is less than 0 and is equal to $-1$ if $V_y$ is greater than 0.

6. A circuit according to claim 1, where the controllable oscillator comprises a voltage controlled oscillator having a control input, and a loop filter connected to receive the control signal generated by the function generator and to apply a signal to the control input of the oscillator, which signal has a component that is proportional to the voltage of the control signal received by the loop filter.

7. A circuit according to claim 6, wherein the signal applied to the control input of oscillator also has a component proportional to the integral with respect to time of the voltage of the control signal received by the loop filter.

8. A phase-locked loop circuit for receiving an input signal that has a predetermined frequency during a succession of intervals and of which the phase during a given interval is related to the phase during a reference interval by the angle $2n\pi/N$, where N is a positive integer and n is an integer in the range from 0 to $N-1$, the circuit being operative to generate a reference signal of which the frequency bears a desired relationship to said predetermined frequency and comprising a controllable oscillator that is responsive to a control signal to generate the reference signal, the frequency of the reference signal being a function of the value of the control signal and bearing a predetermined relationship to the predetermined frequency when the value of the control signal is substantially zero, and the circuit also comprising a demodulator for providing an output that unambiguously defines the phase of the input signal relative to the reference signal, and a function generator for receiving the output of the demodulator and generating the control signal such that when the phase of the input signal relative to the reference signal is equal to $2n\pi/N$ plus the phase of the input signal relative to the reference signal during the reference interval, the value of the control signal is zero and the first derivative of the value of the control signal with respect to the phase of the input signal relative to the reference signal is such that a change in the value of the control signal causes the frequency of the reference signal to change in such a manner as to restore the value of the control signal to zero.

9. A circuit according to claim 8, wherein the function relating the frequency of the reference signal to the value of the control signal is a proportional function.

10. A circuit according to claim 8, wherein the function relating the frequency of the reference signal to the value of the control signal is a proportional plus integral function.

11. A method of generating a reference signal in response to an input signal that has a predetermined frequency during a succession of intervals and of which the phase during a given interval is related to the phase during a reference interval by the angle $2n\pi/N$, where N is a positive integer and n is an integer in the range from zero to $N-1$ the frequency of the reference signal bearing a desired relationship to said predetermined frequency, said method comprising generating the reference signal in response to a control signal, the frequency of the reference signal being a function of the value of the control signal and bearing said desired relationship to the predetermined frequency when the value of the control signal is substantially zero, generating an unambiguous indication of the phase of the input signal relative to the reference signal, and generating the control signal as a function of the phase of the input signal relative to the reference signal such that when the phase of the input signal relative to the reference signal is equal to $2n\pi/N$ plus the phase of the input signal relative to the reference signal during the reference interval, the value of the control signal is zero and the first derivative of the value of the control signal with respect to the phase of the input signal relative to the reference signal is such that a change in the value of the control signal causes the frequency of the reference signal to change in such a manner as to restore the value of the control signal to zero.

12. A method according to claim 11, wherein the function relating the frequency of the reference signal to the value of the control signal is a proportional function.

13. A circuit according to claim 11, wherein the function relating to the frequency of the reference signal to the value of the control signal is a proportional plus integral function.

* * * * *